(12) United States Patent
Bangsaruntip et al.

(10) Patent No.: US 8,772,755 B2
(45) Date of Patent: *Jul. 8, 2014

(54) DIRECTIONALLY ETCHED NANOWIRE FIELD EFFECT TRANSISTORS

(75) Inventors: Sarunya Bangsaruntip, Mount Kisco, NY (US); Guy M. Cohen, Mohegan Lake, NY (US); Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/550,700

(22) Filed: Jul. 17, 2012

(65) Prior Publication Data

US 2012/0280204 A1 Nov. 8, 2012

Related U.S. Application Data

(62) Division of application No. 12/776,485, filed on May 10, 2010, now Pat. No. 8,361,907.

(51) Int. Cl.
*H01L 29/72* (2006.01)
(52) U.S. Cl.
USPC .... 257/9; 257/24; 257/E27.064; 257/E29.04; 977/762; 977/888
(58) Field of Classification Search
USPC ........... 257/9, 24, E27.064, E29.04; 977/762, 977/888
See application file for complete search history.

(56) References Cited

U.S. PATENT DOCUMENTS

| | | | |
|---|---|---|---|
| 4,995,001 A | 2/1991 | Dawson et al. | |
| 5,308,445 A | 5/1994 | Takasu | |
| 5,438,018 A | 8/1995 | Mori et al. | |
| 5,552,622 A | 9/1996 | Kimura | |
| 5,574,308 A | 11/1996 | Mori et al. | |
| 5,668,046 A | 9/1997 | Koh et al. | |
| 6,365,465 B1 | 4/2002 | Chan et al. | |

(Continued)

FOREIGN PATENT DOCUMENTS

| | | |
|---|---|---|
| EP | 217811 A1 | 4/2010 |
| KR | 20090044799 A | 5/2009 |
| WO | 02084757 A1 | 10/2002 |
| WO | WO2008069765 A1 | 6/2008 |

OTHER PUBLICATIONS

Andriotis et al., Realistic nanotube-metal contact configuration for molecular electronics applications, IEEE Sensors Journal, vol. 8, No. 6, Jun. 2008.

(Continued)

*Primary Examiner* — Edward Wojciechowicz
(74) *Attorney, Agent, or Firm* — Cantor Colburn LLP; Vazken Alexanian

(57) ABSTRACT

A nanowire field effect transistor (FET) device, includes a source region comprising a first semiconductor layer disposed on a second semiconductor layer, the source region having a surface parallel to {110} crystalline planes and opposing sidewall surfaces parallel to the {110} crystalline planes, a drain region comprising the first semiconductor layer disposed on the second semiconductor layer, the source region having a face parallel to the {110} crystalline planes and opposing sidewall surfaces parallel to the {110} crystalline planes, and a nanowire channel member suspended by the source region and the drain region, wherein nanowire channel includes the first semiconductor layer, and opposing sidewall surfaces parallel to {100} crystalline planes and opposing faces parallel to the {110} crystalline planes.

4 Claims, 8 Drawing Sheets

(56) References Cited

U.S. PATENT DOCUMENTS

| | | |
|---|---|---|
| 6,642,115 B1 | 11/2003 | Cohen et al. |
| 6,653,209 B1 | 11/2003 | Yamagata |
| 6,806,141 B2 | 10/2004 | Kamins |
| 6,835,618 B1 | 12/2004 | Dakshina-Murthy et al. |
| 6,855,606 B2 | 2/2005 | Chen et al. |
| 6,882,051 B2 | 4/2005 | Majumdar et al. |
| 6,891,227 B2 | 5/2005 | Appenzeller et al. |
| 6,903,013 B2 | 6/2005 | Chan et al. |
| 6,996,147 B2 | 2/2006 | Majumdar et al. |
| 7,101,762 B2 | 9/2006 | Cohen et al. |
| 7,151,209 B2 | 12/2006 | Empedocles et al. |
| 7,180,107 B2 | 2/2007 | Appenzeller et al. |
| 7,211,853 B2 | 5/2007 | Bachtold et al. |
| 7,253,060 B2 | 8/2007 | Yun et al. |
| 7,297,615 B2 | 11/2007 | Cho et al. |
| 7,311,776 B2 | 12/2007 | Lin et al. |
| 7,443,025 B2 | 10/2008 | Verbist |
| 7,446,025 B2 | 11/2008 | Cohen et al. |
| 7,449,373 B2 | 11/2008 | Doyle et al. |
| 7,452,759 B2 | 11/2008 | Sandhu |
| 7,452,778 B2 | 11/2008 | Chen et al. |
| 7,456,068 B2 | 11/2008 | Kavalieros et al. |
| 7,456,476 B2 | 11/2008 | Hareland et al. |
| 7,473,943 B2 | 1/2009 | Mostarshed et al. |
| 7,498,211 B2 | 3/2009 | Ban et al. |
| 7,534,675 B2 | 5/2009 | Bangsaruntip et al. |
| 7,550,333 B2 | 6/2009 | Shah et al. |
| 7,569,941 B2 | 8/2009 | Majumdar et al. |
| 7,642,578 B2 | 1/2010 | Lee et al. |
| 7,791,144 B2 | 9/2010 | Chidambarrao et al. |
| 7,795,677 B2 | 9/2010 | Bangsaruntip et al. |
| 7,799,657 B2 | 9/2010 | Dao |
| 7,803,675 B2 | 9/2010 | Suk et al. |
| 7,834,345 B2 | 11/2010 | Bhuwalka et al. |
| 7,871,870 B2 | 1/2011 | Mostarshed et al. |
| 7,893,506 B2 | 2/2011 | Chau et al. |
| 8,064,249 B2 | 11/2011 | Jang et al. |
| 8,097,515 B2 | 1/2012 | Bangsaruntip et al. |
| 8,154,127 B1 | 4/2012 | Kamins et al. |
| 8,338,280 B2 | 12/2012 | Tan et al. |
| 8,541,774 B2* | 9/2013 | Bangsaruntip et al. ......... 257/24 |
| 2004/0149978 A1 | 8/2004 | Snider |
| 2004/0166642 A1 | 8/2004 | Chen et al. |
| 2005/0121706 A1 | 6/2005 | Chen et al. |
| 2005/0266645 A1 | 12/2005 | Park |
| 2005/0275010 A1 | 12/2005 | Chen et al. |
| 2006/0033145 A1 | 2/2006 | Kakoschke et al. |
| 2006/0131665 A1 | 6/2006 | Murthy et al. |
| 2006/0138552 A1 | 6/2006 | Brask et al. |
| 2006/0197164 A1 | 9/2006 | Lindert et al. |
| 2007/0001219 A1 | 1/2007 | Radosavljevic et al. |
| 2007/0267619 A1 | 11/2007 | Nirschl |
| 2007/0267703 A1 | 11/2007 | Chong et al. |
| 2007/0284613 A1 | 12/2007 | Chui et al. |
| 2008/0014689 A1 | 1/2008 | Cleavelin et al. |
| 2008/0061284 A1 | 3/2008 | Chu et al. |
| 2008/0067495 A1 | 3/2008 | Verhulst |
| 2008/0067607 A1 | 3/2008 | Verhulst et al. |
| 2008/0079041 A1 | 4/2008 | Suk et al. |
| 2008/0085587 A1 | 4/2008 | Wells et al. |
| 2008/0121932 A1 | 5/2008 | Ranade |
| 2008/0128760 A1 | 6/2008 | Jun et al. |
| 2008/0135949 A1 | 6/2008 | Lo et al. |
| 2008/0142853 A1 | 6/2008 | Orlowski |
| 2008/0149914 A1 | 6/2008 | Samuelson et al. |
| 2008/0149997 A1 | 6/2008 | Jin et al. |
| 2008/0150025 A1 | 6/2008 | Jain |
| 2008/0179752 A1 | 7/2008 | Yamauchi et al. |
| 2008/0191196 A1 | 8/2008 | Lu et al. |
| 2008/0224224 A1 | 9/2008 | Vandenderghe et al. |
| 2008/0227259 A1 | 9/2008 | Avouris et al. |
| 2008/0246021 A1 | 10/2008 | Suk et al. |
| 2008/0247226 A1 | 10/2008 | Liu et al. |
| 2008/0290418 A1 | 11/2008 | Kalburge |
| 2009/0026553 A1 | 1/2009 | Bhuwalka et al. |
| 2009/0057650 A1 | 3/2009 | Lieber et al. |
| 2009/0057762 A1 | 3/2009 | Bangsaruntip et al. |
| 2009/0061568 A1 | 3/2009 | Bangsaruntip et al. |
| 2009/0090934 A1 | 4/2009 | Tezuka et al. |
| 2009/0134467 A1 | 5/2009 | Ishida et al. |
| 2009/0149012 A1 | 6/2009 | Brask et al. |
| 2009/0181477 A1 | 7/2009 | King et al. |
| 2009/0217216 A1 | 8/2009 | Lee et al. |
| 2009/0294864 A1 | 12/2009 | Suk et al. |
| 2010/0140589 A1 | 6/2010 | Ionescu |
| 2010/0193770 A1 | 8/2010 | Bangsaruntip et al. |
| 2010/0207102 A1 | 8/2010 | Lee et al. |
| 2011/0012176 A1* | 1/2011 | Chidambarrao et al. ..... 257/255 |
| 2011/0133167 A1* | 6/2011 | Bangsaruntip et al. ......... 257/24 |
| 2011/0133169 A1 | 6/2011 | Bangsaruntip et al. |
| 2011/0147840 A1 | 6/2011 | Cea et al. |
| 2012/0146000 A1 | 6/2012 | Bangsaruntip et al. |
| 2013/0001517 A1 | 1/2013 | Bangsaruntip et al. |

OTHER PUBLICATIONS

Bahar, R., 'Trends and Future Directions in Nano Structure Based Computing and Fabrication', ICCD 2006, International Conf. on Computer Design, Oct. 1-4, 2007, pp. 522-527.

Bjork, M.T. et al., "Silicon Nanowire Tunneling Field-Effect Transistors," Applied Physics Letters 92, 193504 (2008).

Buddharaju et al., 'Gate-All-Around Si-Nanowire CMOS Inverter Logic Fabricated Using Top-Down Approach', European Solid-State Device Research Conference, Sep. 11-11, 2007, pp. 303-306.

Chen et al., 'Demonstration of Tunneling FETs Based on Highly Scalable Verticle Silicon Nanowires', IEEE Electron Device Letters, vol. 30, No. 7, Jul. 2009, pp. 754-756.

Ernst et al., "3D Multichannels and Stacked Nanowires Technologies for New Design Opportunities in Nanoelectronics," IEEE International Conference on Integrated Circuit Design and Technology and Tutorial, 2008. ICICDT 2008. Jun. 2-4, 2008 pp. 265-268.

Gates, Alexander J., "Designing a Nanoelectronic Circuit to Control a Millimeter-scale Walking Robot," Mitre Technical Paper, Nov. 2004, http://www.mitre.org/work/tech_papers/tech_papers_04/04_1248/04_1248.pdf.

Hu et al., 'Fringing field effects on electrical resistivity of semiconductor nanowire-metal contacts', Applied Physics Letters 92, 083503_2008.

International Search Report; International Application No. PCT/US2011/029304; International Filing Date: Mar. 22, 2011; Date of Mailing: May 20, 2011.

Knoch et al., 'Tunneling phenomena in carbon nanotube field-effect transistors', Phys Stat Sol. (a) 205, No. 4, 679-694 (2008).

Lauhon et al., 'Epitaxial core-shell and core-multishell nanowire heterostructures', Nature, vol. 420, Nov. 7, 2002, pp. 57-61.

Leonard et al., 'Size-dependent effects on electrical contacts to nanotubes and nanowires', Phys Rev Lett., Jul. 14, 2006; 97(2):026804.

Ma et al., 'High-performance nanowire complementary metal-semiconductor inverters', Applied Physics Letters 93, 053105_2008.

Mehrotra, Saumitra Raj, A Simulation Study of Silicom Nanowire Field Effect Transistors (FETs), University of Cincinnati, Jul. 2007.

Neudeck, G.W., "An Overview of Double-Gate MOSFETs," Proceedings of 15th Biennial University/Government/Industry Microelectronics Symposium. UGIM 2003. New York, NY: IEEE, US, Jun. 30-Jul. 2, 2003., Jun. 30, 2003, pp. 214-217.

International Search Report; International Application No. PCT/EP2010/066961; International Filing Date: Nov. 8, 2010; Date of Mailing: Feb. 10, 2011.

International Search Report; International Application No. PCT/EP2010/066483; International Filing Date: Oct. 29, 2010; Date of Mailing: Feb. 7, 2011.

International Search Report—Written Opinion; International Application No. PCT/EP2010/066483; International Filing Date: Oct. 29, 2010; Date of Mailing: Feb. 7, 2011.

International Search Report; International Application No. PCT/US11/49501; International Filing Date: Aug. 29, 2011; Date of Mailing: Jan. 18, 2012.

(56) References Cited

OTHER PUBLICATIONS

International Search Report—Written Opinion; International Application No. PCT/EP2010/066961; International Filing Date: Nov. 8, 2010; Date of Mailing: Feb. 10, 2011.
International Search Report Written Opinion; International Application No. PCT/US11/49501; International Filing Date: Aug. 29, 2011; Date of Mailing: Jan. 18, 2012.
Office Action—Non-Final for U.S. Appl. No. 12/778,315, filed May 12, 2010; First Named Inventor: Sarunya Bangsaruntip; Mailing Date: Mar. 26, 2012.
Pavanello et al., "Evaluation of Triple-Gate FinFETs With SiO2—HfO2—TiN Gate Stack Under Analog Operation," Solid State Electronics, Elsevier Science Publishers, Barking, GB, vol. 51, No. 2, Mar. 7, 2007, pp. 285-291.
Office Action—Restriction-Election for U.S. Appl No. 12/758,939, filed Apr. 13, 2010; First Named Inventor: Sarunya Bangsaruntip; Mailing Date: Jun. 8, 2012.
Singh et al., 'Si, SiGe Nanowire Devices by Top-Down Technology and Their Applications', IEEE Transactions on Electron Devices, vol. 55, No. 11, Nov. 2008, pp. 3107-3118.
Su, Taichi et al., New Planar Self-Aligned Double-Gate Fully Depleted P-MOSFET's Using Epitaxial Lateral Overgrowth (ELO) and Selectively Grown Source/Drain (S/D).
Checka, N., "Circuit Architecture for 3D Integration", Chapter 13 in Wafer Level 3-D ICs Process Technology, ed. C.S. Tan, Springer US, 2008, ISBN 978-0-387-76534-1.
International Search Report—Written Opinion; International Application No. PCT/US2011/029304; International Filing Date: Mar. 22, 2011; Date of Mailing: May 20, 2011.
Xiang, Jie et al., "Ge/Si Nanowire Heterostructures as High-Performance Field-Effect Transistors," Nature 441, 489-493 (May 25, 2006).
Ziegler, M.M. et al., "The CMOS/NANO Interface from a Circuits Perspective," ISCAS '03. Proceedings of the 2003 International Symposium on Circuits and Systems, 2003, May 25-28, 2003, vol. 4, pp. IV-904-IV-907.
Chen et al., "An Integrated Logic Circuit Assembled ona Single Carbon Nanotube", www.sciencemag.org Science, vol. 311, Mar. 24, 2006, p. 1735.
Derycke, et al, "Carbon Nanotube Inter- and Intramolecular Logic Gates" Nano Letters, Sep. 2001, vol. 1, No. 9, pp. 453-456.
Office Action—Non-Final for U.S. Appl. No. 12/684,280, filed Jan. 8, 2010; First Named Inventor: Sarunya Bangsaruntip; Mailing Date: May 2, 2011.
Office Action—Non-Final for U.S. Appl. No. 12/856,718, filed Aug. 16, 2010; first Named Inventor Sarunya Bangsaruntip; Mailing Date: Jul. 9, 2012.
Office Action—Restriction Election for U.S. Appl. No. 12/684,280, filed Jan. 8, 2010; First Named Inventor: Sarunya Bangsaruntip; Mailing Date: Feb. 10, 2011.
Office Action—Final for U.S. Appl. No. 12/684,280, filed Jan. 8, 2010; First Namd Inventor: Sarunya Bangsaruntip; Mailing Date: Oct. 5, 2011.
Notice of Allowance for U.S. Appl. No. 12/766,485, filed May 10, 2010; First Named Inventor: Sarunya Bangsaruntip; Mailing Date: Sep. 26, 2012.
Office Action—Final for U.S. Appl. No. 13/372,719, filed Feb. 14, 2012; First Named Inventor: Sarunya Bangsaruntip; Mailing Date: Sep. 4, 2012.
Office Action—Non-Final for U.S. Appl. No. 12/631,199, filed Dec. 4, 2009; First Named Inventor: Sarunya Bangsaruntip; Mailing Date: Jun. 13, 2012.
Office Action—Non-Final for U.S. Appl. No. 12/856,718, filed Aug. 16, 2010; First Named Inventor: Sarunya Bangsaruntip; Mailing Date: Jul. 9, 2012.
Office Action—Restriction-Election for U.S. Appl. No. 12/856,718, filed Aug. 16, 2010; First Named Inventor: Sarunya Bangsaruntip; Mailing Date: Apr. 9, 2012.
International Search Report; International Application No. PCT/EP2011/053174; International Filing Date: Mar. 3, 2011; Date of Mailing: May 31, 2011.
International Search Report—Written Opinion; International Application No. PCT/EP2011/053174; International Filing Date: Mar. 3, 2011; Date of Mailing: May 31, 2011.
Office Action—Final for U.S. Appl. No. 12/856,718, filed Aug. 16, 2010; First Named Inventor: Sarunya Bangsaruntip; Mailing Date: Dec. 13, 2012.
Office Action—Non-Final for U.S. Appl. No. 13/556,300, filed Jul. 24, 2012; First Named Inventor: Sarunya Bangsaruntip; Mailing Date: Dec. 10, 2012.
Office Action—Non-Final for U.S. Appl. No. 13/600,585, filed Aug. 31, 2012; First Named Inventor: Sarunya Bangsaruntip; Mailing Date: Dec. 13, 2012.
Office Action—Non-Final for U.S. Appl. No. 13/551,995, filed Jul. 18, 2012; First named Inventor: Sarunya Bangsaruntip; Mailing Date: Dec. 19, 2012.
Office Action—Non-Final for U.S. Appl. No. 12/776,485, filed May 10, 2010; Fist Named Inventor: Sarunya Bangsaruntip; Mailing Date: Feb. 21, 2012.
Office Action—Non-Final for U.S. Appl. No. 13/372,719, filed Feb. 14, 2012; First named Inventor: Sarunya Bangsaruntip; Mailing Date: May 7, 2012.
Office Action—Non-Final for U.S. Appl. No. 13/372,719, filed Feb. 14, 2012; First Named Inventor: Sarunya Bangsaruntip; Mailing Date: Jul. 5, 2013, 28 pgs.
Office Action—Non-Final for U.S. Appl. No. 13/372,714, filed Feb. 14, 2012; Fist Named Inventor: Sarunya Bangsaruntip et al.; Mailing Date: Sep. 20, 2012.
Office Action—Non-Final for U.S. Appl. No. 13/372,719, filed Feb. 14, 2012; First Named Inventor: Sarunya Bangsaruntip; Mailing Date: Sep. 4, 2012.
Office Action—Non-Final for U.S. Appl. No. 12/844,707, filed Sep. 17, 2010; Fist Named Inventor: Sarunya Bangsaruntip et al.; Mailing Date: Oct. 2, 2012.
Office Action—Restriction Election for U.S. Appl. No. 12/776,485, filed May 10, 2010; First Named Inventor : Sarunya Bangsaruntip; Mailing Date: Dec. 9, 2011.
Transmittal and International Preliminary Report on Patentability for International Application No. PCT/US2011/029304; International Filing Date: Mar. 22, 2011; date of mailing Oct. 26, 2012, 2 pages.
Office Action—Notice of Allowance for U.S. Appl. No. 13/551,995, filed Jul. 18, 2012; First Named Inventtor: Sarunya Bangsaruntip; Mailing Date: Jul. 15, 2013; 13 pages.
Office Action—Final for U.S. Appl. No. 13/551,995, filed Jul. 18, 2012; First Named Inventor: Sarunya Bangsaruntip; Mailing Date Apr. 30, 2013; 11 pgs.
Written Opinion for International Application No. PCT/US2011/029304; International Filing Date: Mar. 22, 2011; mailing date: May 20, 2011; 5 pages.

\* cited by examiner

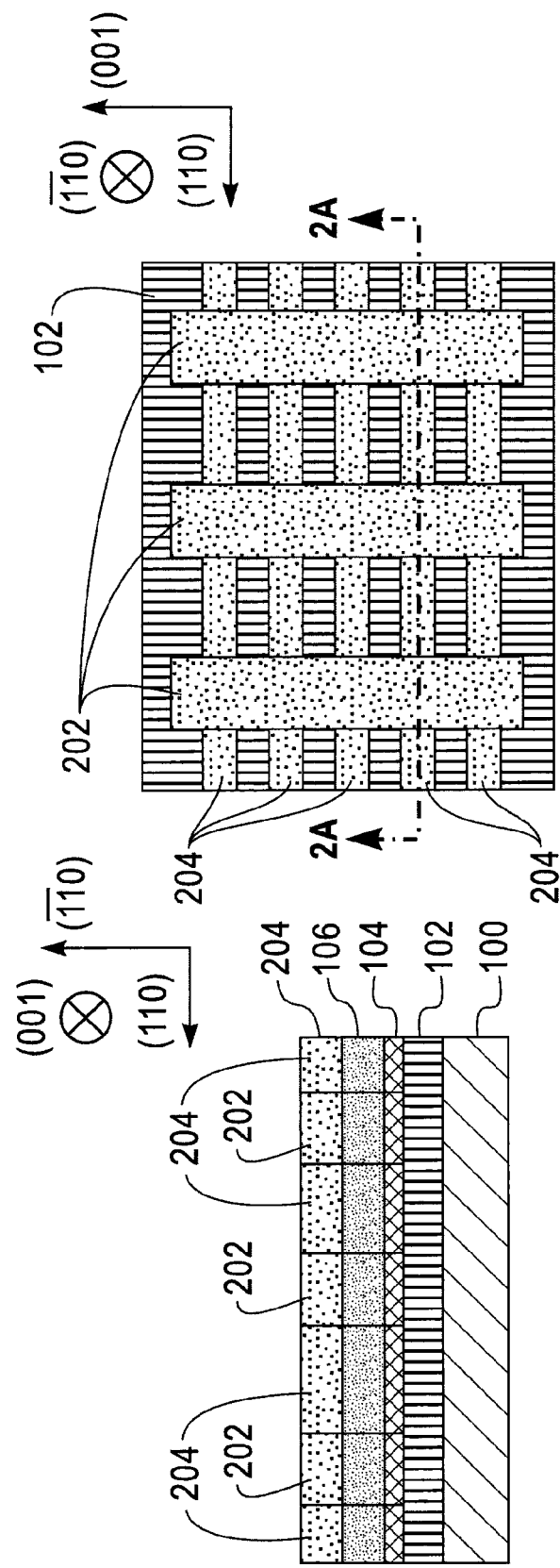

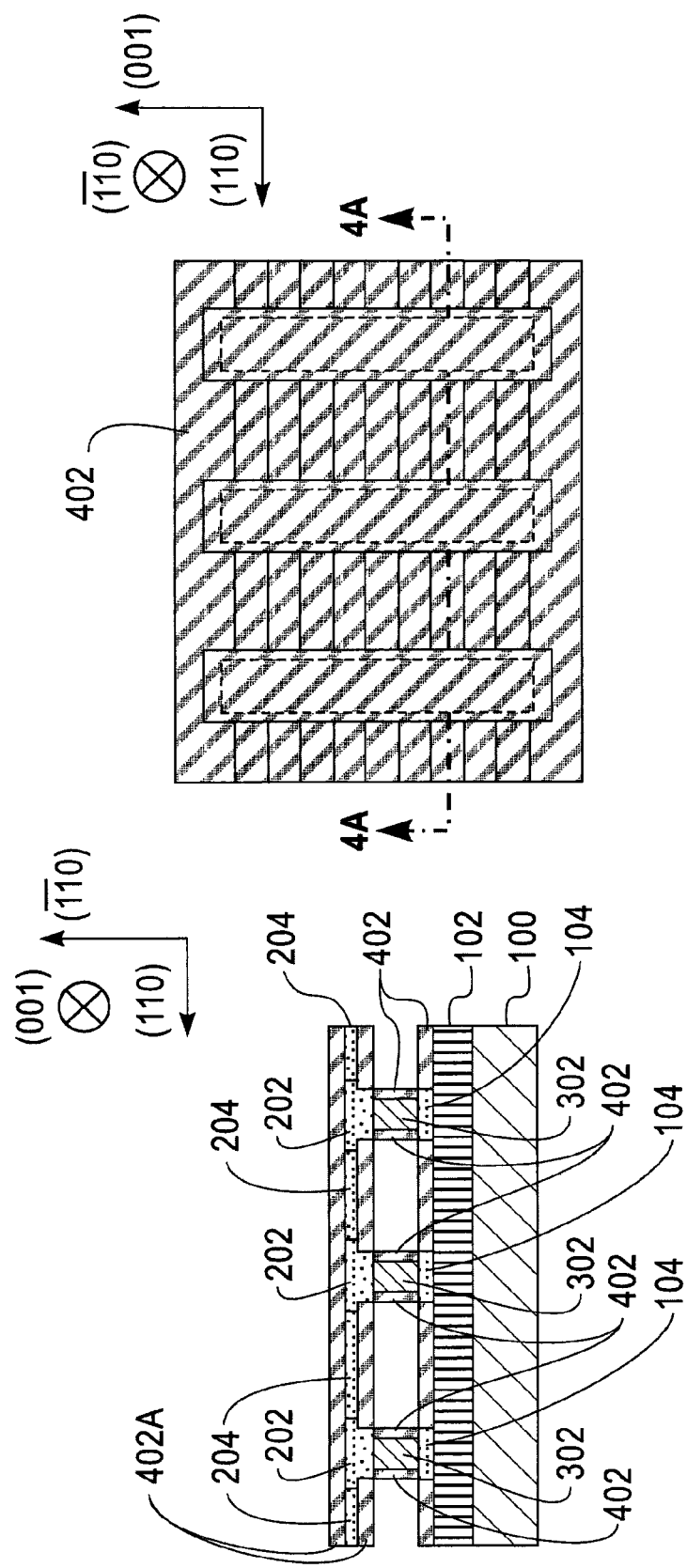

DIRECTIONALLY ETCHED NANOWIRE FIELD EFFECT TRANSISTORS

CROSS-REFERENCE TO RELATED APPLICATIONS

This is a divisional application of application Ser. No. 12/776,485, filed May 10, 2010 now U.S. Pat. No. 8,361,907.

FIELD OF INVENTION

The present invention relates to semiconductor nanowire field effect transistors and to methods that allow the fabrication of nanowire field effect transistors in a dense array.

DESCRIPTION OF RELATED ART

The fabrication of a nanowire field effect transistor (FET) with a gate conductor surrounding the nanowire channel (also known as a gate-all-around nanowire FET) includes suspension of the nanowires. Suspension of the nanowires allows for the gate conductor to cover all surfaces of the nanowires.

The fabrication of a gate-all-around nanowire FET typically includes the following steps: (1) Definition of the nanowires between source and drain regions by patterning a silicon-on-insulator (SOI) layer. (2) Suspension of the nanowires by isotropic etching that undercuts the insulator on which the nanowires are resting. This etching step also undercuts the insulator at the edge of the source and drain region. The overhang/undercut that forms may not be a desirable outcome. (3) A blanket and conformal deposition of the gate conductor. The gate conductor warps around the suspended nanowires but also fills the undercut at the edge of the source and drain regions. (4) Definition of the gate line which includes the etching of the gate line and removal of gate conductor material from all regions outside the gate line, including gate material deposited in the cavities at the edge of the source and drain regions.

BRIEF SUMMARY

In one aspect of the present invention, a nanowire field effect transistor (FET) device, includes a source region comprising a first semiconductor layer disposed on a second semiconductor layer, the source region having a surface parallel to {110} crystalline planes and opposing sidewall surfaces parallel to the {110} crystalline planes, a drain region comprising the first semiconductor layer disposed on the second semiconductor layer, the source region having a face parallel to the {110} crystalline planes and opposing sidewall surfaces parallel to the {110} crystalline planes, and a nanowire channel member suspended by the source region and the drain region, wherein nanowire channel includes the first semiconductor layer, and opposing sidewall surfaces parallel to {100} crystalline planes and opposing faces parallel to the {110} crystalline planes.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 1A-8B illustrate an exemplary method for forming field effect transistor (FET) devices.

DETAILED DESCRIPTION

The formation of the undercut (in step 3; described in the Description of Related Art section above) imposes a limitation on the density of circuits built with gate-all-around nanowire FET. The undercut size should be at least half of the width of the nanowires, or the nanowires may not be fully suspended by the etching. The undercut under the source (or drain) region should be smaller than half of the source (or drain) region width. If the source width is made narrower than two times the undercut size, the source (and drain) may not provide the anchoring for the suspended nanowires. The minimum width of the source and the drain dictates the area the device occupies. In addition to the circuit density limitation the presence of the undercut may lead to fabrication issues. The definition of the gate line (step 4) includes the removal of all the gate conductor material that was deposited in the cavity formed by the undercut. This is typically performed by an isotropic etch, which also etches the gate line. As a result, control of the gate line dimensions may be difficult to obtain.

Figure 1A:
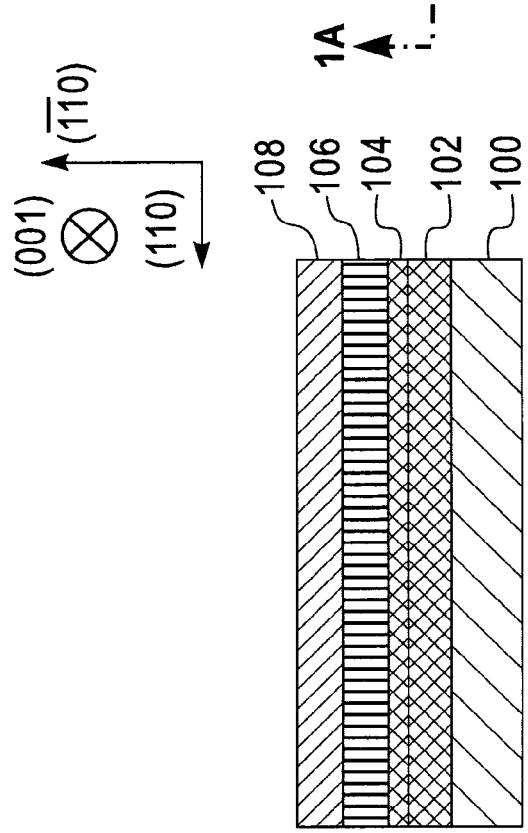
Figure 1B:
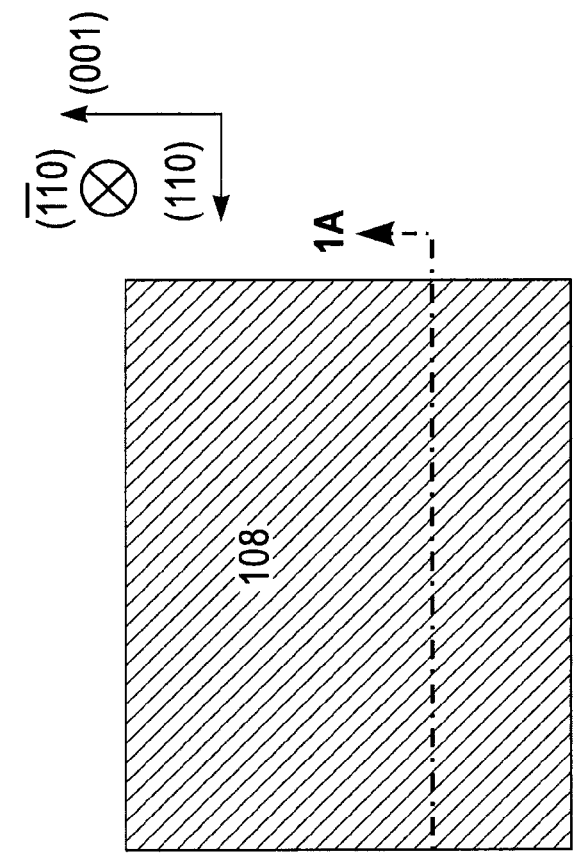

FIG. 1A illustrates a cross-sectional view along the line 1A (of FIG. 1B) and FIG. 1B illustrates a top down view of an exemplary method for forming a field effect transistor (FET) device. FIG. 1A includes a substrate 100 (for example a silicon substrate); a buried oxide (BOX) layer 102 disposed on the substrate 100; a silicon on insulator (SOI) layer 104 disposed on the BOX layer 102; a crystalline layer 106 such as, for example, a crystalline silicon germanium layer (SiGe) disposed on the SOI layer 104; and a second silicon layer 108 disposed on the crystalline layer 106.

FIGS. 2A and 2B illustrate the resultant structure including anchor portions 202 and nanowire portions 204 that are patterned in the films stack formed by layers 104, 106, and 108. The anchor portions 202 and nanowire portions 204 may be patterned by the use of lithography followed by an etching process such as, for example, reactive ion etching (RIE). The etching process removes portions of the crystalline layer 108, 106, and the SOI layer 104 to expose portions of the BOX layer 102. The etched structure of FIG. 2B forms a ladder-like structure in which the rungs 204 have sidewalls parallel to the {100} crystal planes, and the anchors 202, which are connected by the rungs, have sidewalls parallel to the {110} crystal planes. In the example shown in FIG. 2B the rungs and the anchors forms a right angle (90°), the top surface of layer 108 is therefore parallel to the {110} crystal planes. The specification for crystal planes directions follows the Miller indices convention which is described in, e.g., Ashcroft and Mermin, Solid State Physics, chapter 5 (1976), the contents of which are incorporated herein by reference. Following this convention a family of crystal planes, i.e. planes that are equivalent by the virtue of the symmetry of the crystal is typically referenced by a pair of { } parentheses. For example, the planes (100), (010) and (001) are all equivalent in a cubic crystal. One refers to them collectively as {100} planes. In yet another example the {110} planes refer collectively to the (110), (101), (011), planes.

Figures 3A, 3B:
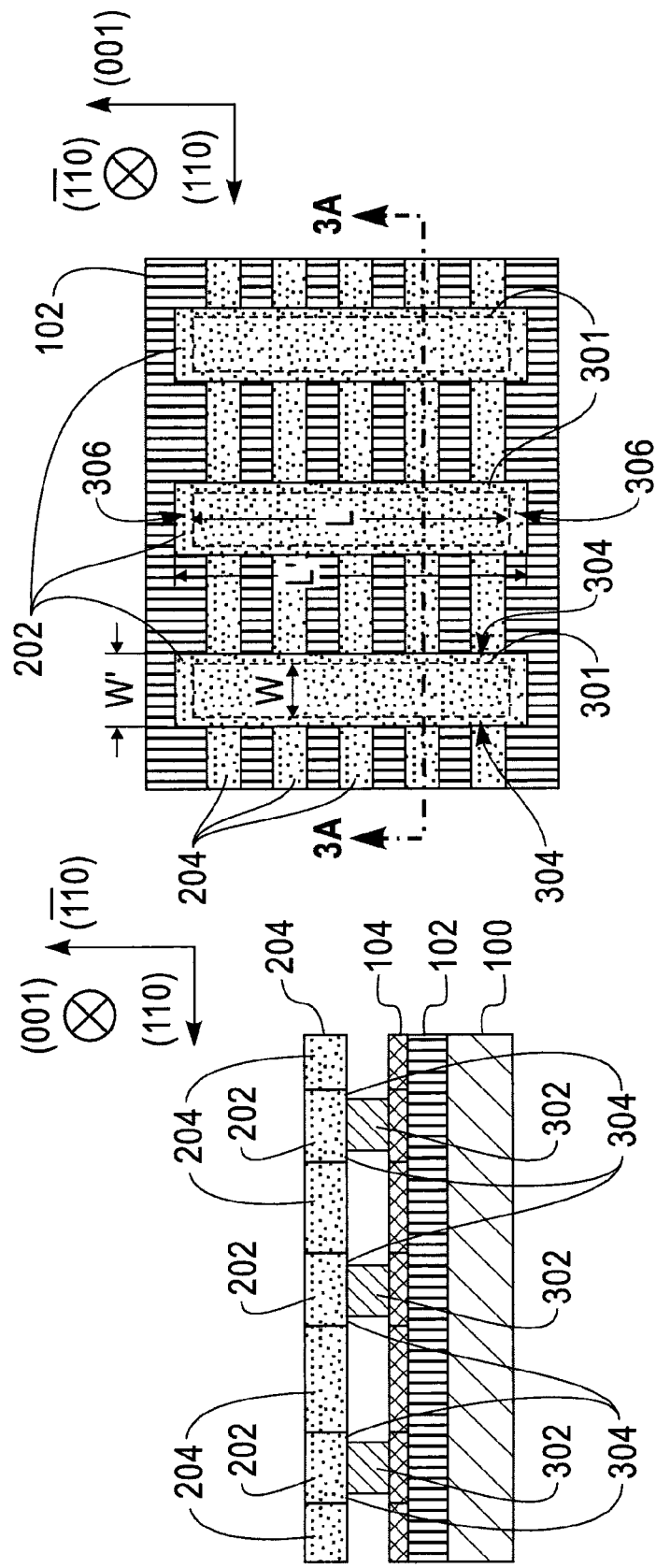

FIGS. 3A and 3B illustrate the resultant structure following an anisotropic etching process that selectively removes portions of the crystalline layer 106 resulting in pedestal portions 302 that are defined in the crystalline layer 106 that support the anchor portions 202. The anisotropic etching process removes the portions of the crystalline layer 106 that are orientated along the lattice plane {100} at a faster rate than the portions of the crystalline layer 106 that are orientated along the lattice plane {110}, resulting in the removal of the crystalline layer 106 that is below the nanowire portions 204, and the suspension of the nanowire portions 204 by the anchor portions 202. FIG. 3B illustrates the top-down profile of the pedestal portions 302 (illustrated by the dotted lines 301) that support the anchor portions 202. The width (w) of the pedestal portions 302 is less than the width (w') of the anchor portions 202, resulting in longitudinal overhang regions 304. The length (L) of the pedestal portions 302 is less than the length (L') of the anchor portions 202 resulting in transverse overhang regions 306. The anisotropic etching process results in the longitudinal overhang regions 304 having a smaller overhang length (W'−W)/2 than the transverse overhang (L'−L)/2 regions 306 due to the {100} planes etching faster than {110} planes in crystalline layer 106. The anisotropic etch exhibits chemical selectivity. The etch chemistry mainly removes the crystalline material 106 but does not substantively etch the crystalline material 108. For example, when layer 108 is silicon and layer 106 is SiGe, hot (gaseous) HCL can be used to selectively etch SiGe with little removal of Si. Additionally, HCL provides an anisotropic etching process as it etches faster the SiGe in the (100) orientation than in the (110) orientation. The etching is typically done when the wafer is kept a temperature of about 800° C.

FIGS. 4A and 4B illustrate the resultant structure following the formation of a thermal oxide layer 402 and 402A on the exposed anchor portions 202, nanowire portions 204, SOI layer 104, and pedestal portions 302. The oxidation process can be dry (with $O_2$) or wet (with $H_2O$ vapor), with typical oxidation temperature from 750° C. to about 1000° C. The thermal oxidation process completely oxidizes the SOI layer 104 due to the thin thickness of the SOI layer 104 relative to the thicknesses of the anchor portions 202, nanowire portions 204, and pedestal portions 302.

Figures 5A, 5B:
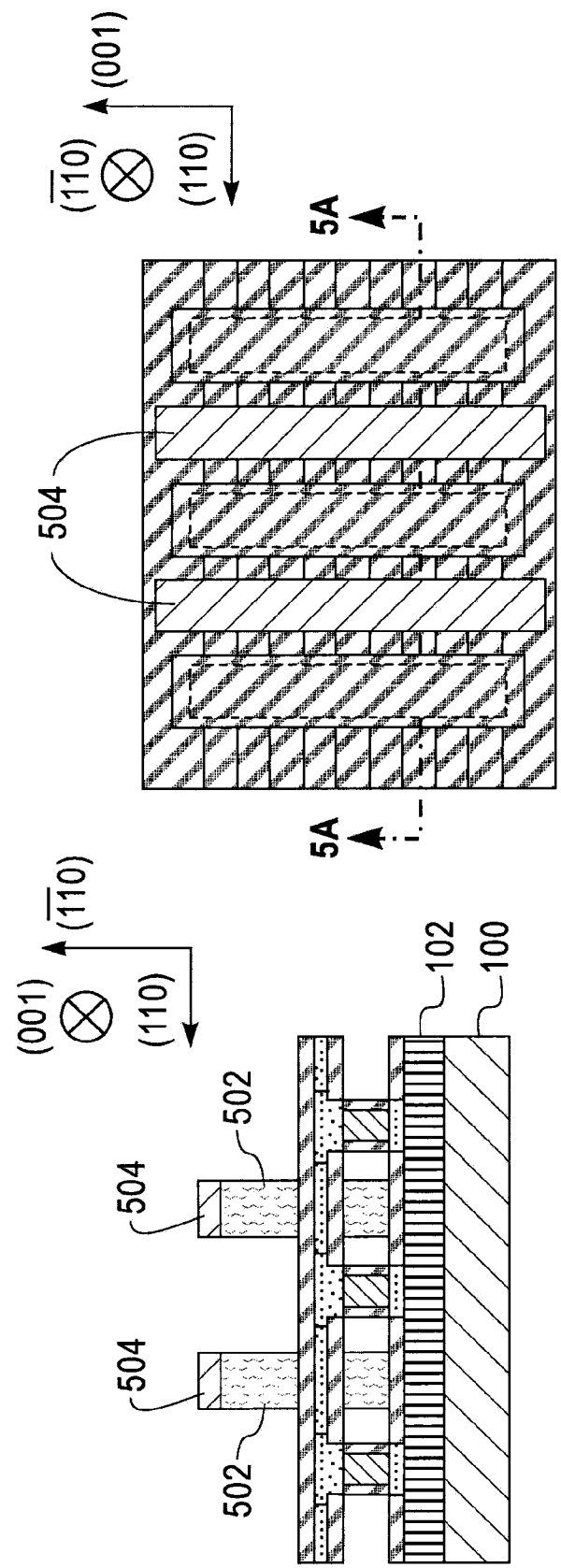

FIGS. 5A and 5B illustrate the resultant structure following the formation of polysilicon gates 502 and hardmask layers 504 such as, for example, silicon nitride ($Si_3N_4$) on the polysilicon gates 502. The polysilicon 502 and the hardmask layer 504 may be formed by depositing polysilicon material over channel regions of the nanowire portions 204, depositing the hardmask material over the polysilicon material, and etching by RIE to form the polysilicon gates 502 and the hardmask layers 504. The etching of the polysilicon gates 502 may be performed by directional etching that results in straight sidewalls of the gate 502. Following the directional etching, polysilicon 502 remains under the nanowire portions 204 and outside the region encapsulated by the gate 502. Isotropic etching may be performed to remove polysilicon 502 from under the nanowire portions 204.

Figures 6A, 6B:
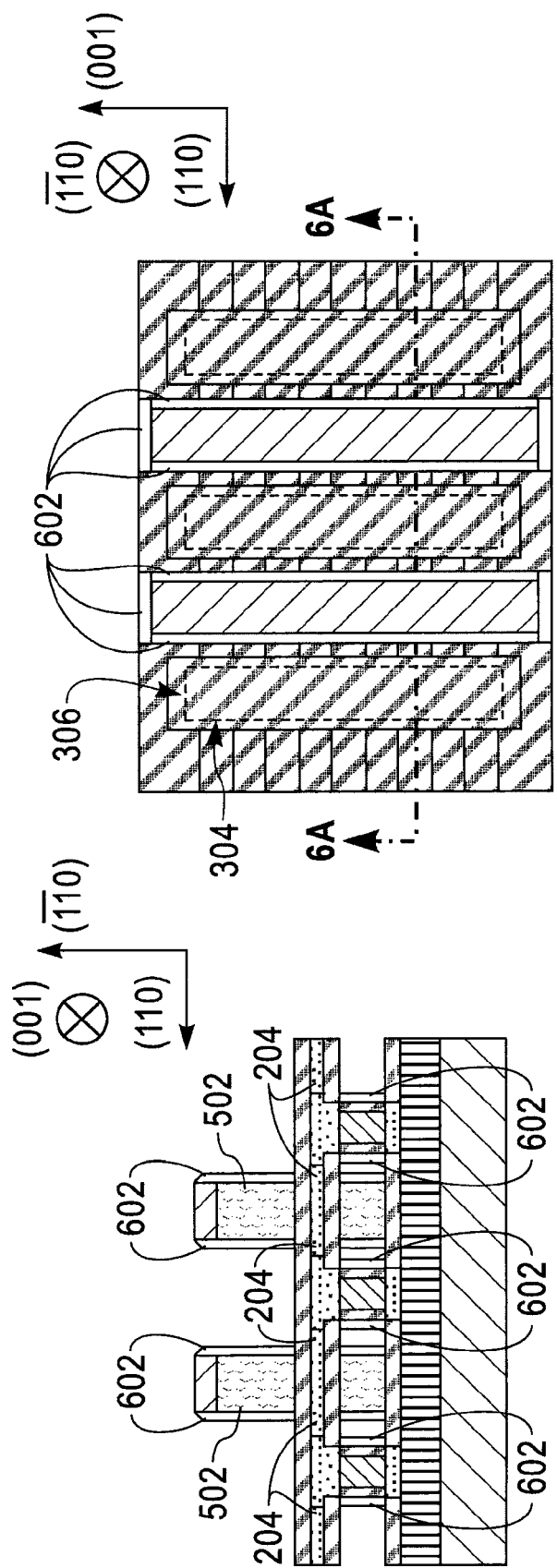

FIGS. 6A and 6B illustrate spacer portions 602 formed along opposing sides of the polysilicon gates 502. The spacers 602 are formed by depositing a blanket dielectric film such as silicon nitride and etching the dielectric film from horizontal surfaces by RIE. FIGS. 6A and 6B include spacer portions 602 that are formed under the nanowire portions 204, and below the overhang regions 304 and 306.

Figures 7A, 7B:
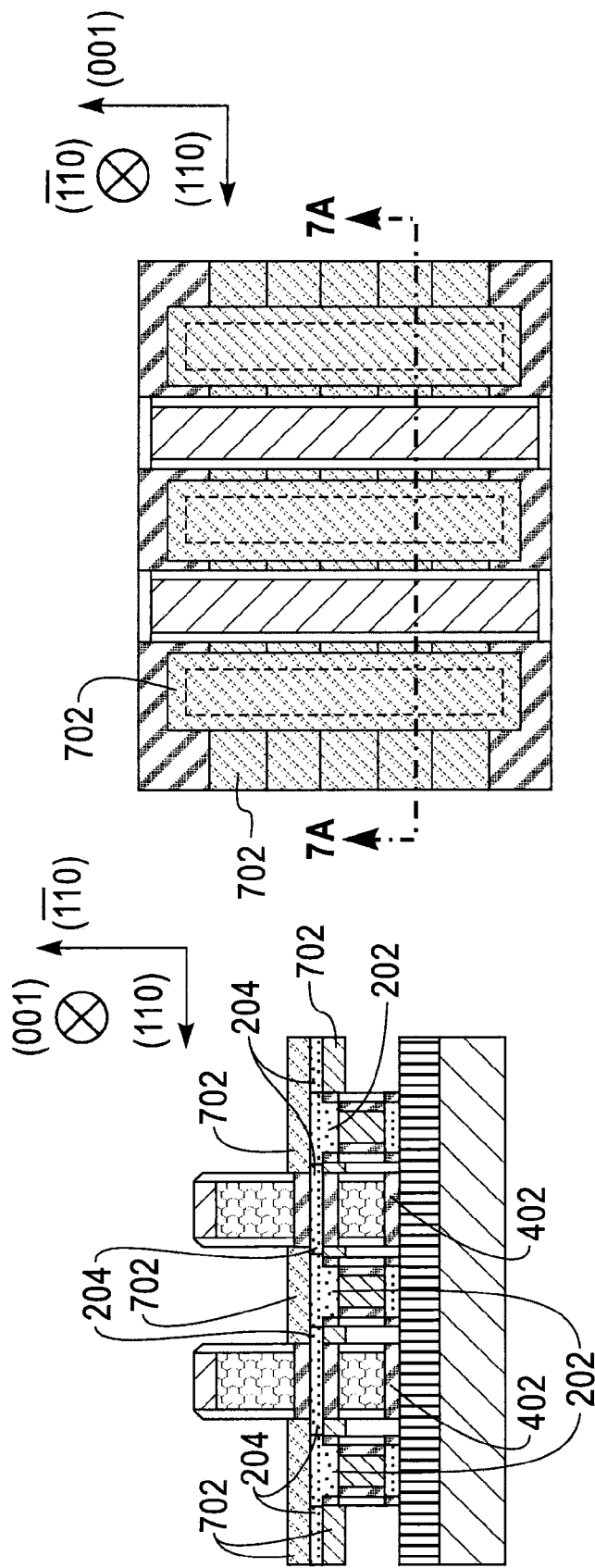

FIGS. 7A and 7B illustrate the resultant structures following a chemical etching process (such as etching with diluted HF) to remove the exposed portions of the thermal oxide layer 402 and a selective epitaxially grown silicon (epi-silicon) 702 that is grown on the exposed silicon of the anchor portions 202 and the nanowire portions 204. The epitaxy may include, for example, the deposition of in-situ doped silicon (Si) or silicon germanium (SiGe) that may be either n-type or p-type doped. The in-situ doped epitaxy process forms the source region and the drain region of the nanowire FET. As an example, a chemical vapor deposition (CVD) reactor may be used to perform the epitaxial growth. Precursors for silicon epitaxy include $SiCl_4$, $SiH_4$ combined with HCL. The use of chlorine allows selective deposition of silicon only on exposed silicon surfaces. A precursor for SiGe may include a mixture of $SiCl_4$ and $GeH_4$. For pure Ge epitaxy only $GeH_4$ is used, and deposition selectivity is typically obtained without HCL. Precursors for dopants may include $PH_3$ or $AsH_3$ for n-type doping and $B_2H_6$ for p-type doping. Deposition temperatures may range from 550° C. to 1000° C. for pure silicon deposition, and as low as 300° C. for pure Ge deposition.

Figures 8A, 8B:
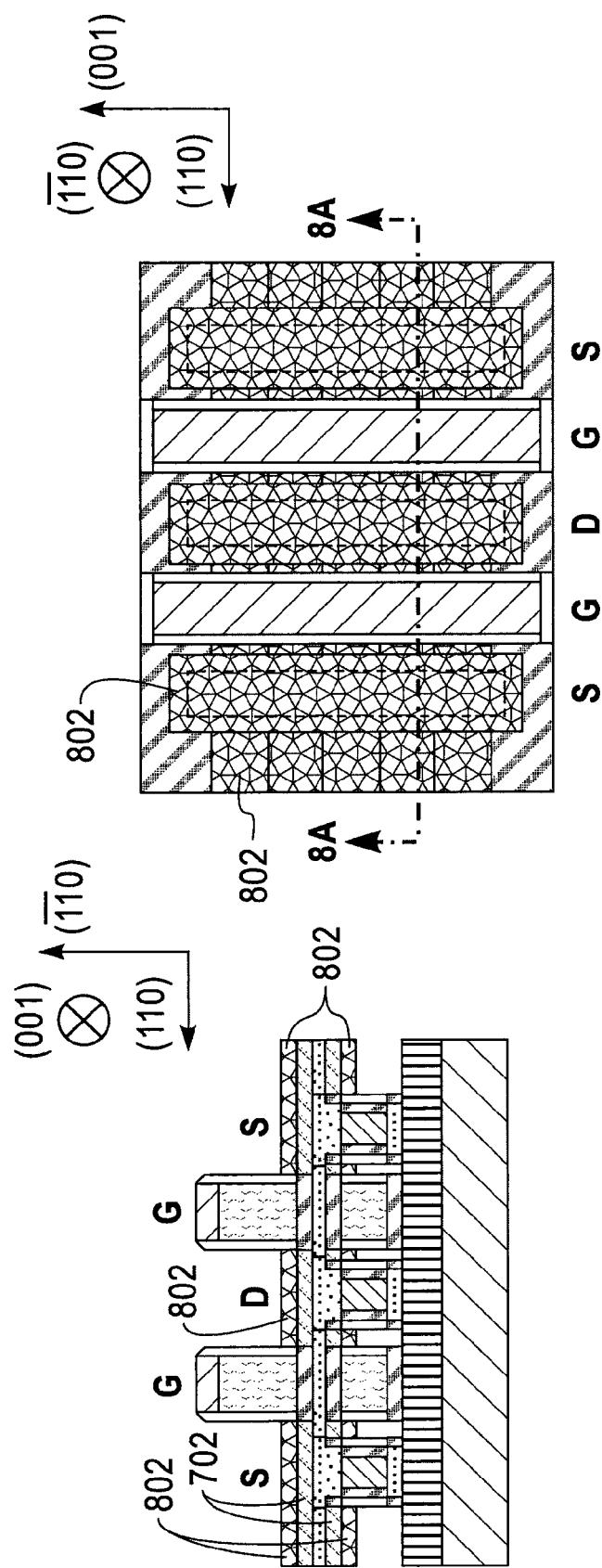

FIGS. 8A and 8B illustrate a resultant structure following silicidation where a silicide 802 is formed on the epi-silicon 702 of the anchor and the epi-thickened nanowire portions 202 and 204. Examples of silicide forming metals include Ni, Pt, Co, and alloys such as NiPt. When Ni is used the NiSi phase is typically formed due to its low resistivity. For example, formation temperatures include 400-600° C. Once the silicidation process is performed, capping layers and vias for connectivity (not shown) may be formed in the source (S), drain (D), and gate (G) regions of the device.

In an alternate exemplary method, high-K/metal gates may be formed on the nanowire portions 204. Referring to FIGS. 4A and 4B, the thermal oxide 402 around the nanowire portions 204 and along the sides of the pedestal portions 302 may be removed by an etching process. A chemical oxide material may be grown on the exposed silicon material, and high-K and gate metal layers are deposited conformally prior to the deposition and etching to form the polysilicon portions 502 and hardmask layers 504 (of FIGS. 5A and 5B). Once the polysilicon 502 and hardmask layers 504 are formed, etching may be performed to remove exposed metal gate material that is not covered by the polysilicon 502. Once the exposed metal gate material is removed, the method may continue as described in FIGS. 6A-8B above.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one ore more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A nanowire field effect transistor (FET) device, comprising:
    a source region comprising a first semiconductor layer disposed on a second semiconductor layer, the source region having a surface parallel to {110} crystalline planes and opposing sidewall surfaces parallel to the {110} crystalline planes;
    a drain region comprising the first semiconductor layer disposed on the second semiconductor layer, the drain region having a face parallel to the {110} crystalline planes and opposing sidewall surfaces parallel to the {110} crystalline planes; and
    a nanowire channel member suspended by the source region and the drain region, wherein nanowire channel includes the first semiconductor layer, and opposing sidewall surfaces parallel to {100} crystalline planes and opposing faces parallel to the {110} crystalline planes.

2. The device of claim 1, further comprising a gate formed around a portion of the nanowire channel member.

3. The device of claim 1, wherein the first semiconductor layer includes silicon.

4. The device of claim 1, wherein the second semiconductor material includes SiGe.

* * * * *